United States Patent
Bae et al.

(10) Patent No.: US 9,519,392 B2
(45) Date of Patent: Dec. 13, 2016

(54) TOUCH SCREEN PANEL FABRICATION METHOD AND TOUCH SCREEN PANEL

(71) Applicant: SAMSUNG DISPLAY CO., LTD., Yongin, Gyeonggi-Do (KR)

(72) Inventors: Joo-Han Bae, Seongnam-si (KR); Jinhwan Kim, Seoul (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 57 days.

(21) Appl. No.: 14/684,902

(22) Filed: Apr. 13, 2015

(65) Prior Publication Data

US 2016/0041647 A1    Feb. 11, 2016

(30) Foreign Application Priority Data

Aug. 6, 2014  (KR) .......................... 10-2014-0101035

(51) Int. Cl.
  *G06F 3/044*  (2006.01)
  *H05K 3/46*  (2006.01)

(52) U.S. Cl.
  CPC ............. *G06F 3/044* (2013.01); *H05K 3/4644* (2013.01); *G06F 2203/04103* (2013.01); *G06F 2203/04111* (2013.01)

(58) Field of Classification Search
  CPC ............ G06F 3/044; G06F 2203/04103; G06F 2203/04111; G06F 2203/04112; H05K 3/4644
  See application file for complete search history.

(56) References Cited

U.S. PATENT DOCUMENTS

| 2011/0157071 | A1* | 6/2011 | Huang | .................... | G06F 3/044 345/174 |
| 2011/0157084 | A1* | 6/2011 | Huang | .................... | G06F 3/044 345/174 |
| 2011/0298750 | A1* | 12/2011 | Wang | .................... | G06F 3/0412 345/174 |
| 2014/0063097 | A1* | 3/2014 | Liu | .................... | G06F 3/041 347/12 |

(Continued)

FOREIGN PATENT DOCUMENTS

KR       10-1101088     12/2011
KR   10-2012-0043342    5/2012

(Continued)

*Primary Examiner* — Tom Sheng
(74) *Attorney, Agent, or Firm* — Lee & Morse, P.C.

(57) ABSTRACT

A method for fabricating a touch screen panel includes forming a metal layer on a substrate, and patterning the metal layer to form a metal pattern including a pad metal layer, a wiring metal layer, a connection metal layer, and a sensing metal layer including metal lines having a mesh shape. The method also includes forming a first transparent conductive layer on the substrate, forming an insulation layer on the first transparent conductive layer, patterning the insulation layer to form a wiring insulation layer, a connection insulation layer, and a sensing insulation layer, patterning the first transparent conductive layer to form a peripheral wiring, a connector, and a sensing electrode; forming a second transparent conductive layer on the substrate including the peripheral wiring, the connector, and the sensing electrode; and patterning the second transparent conductive layer to form a pad area and a bridge.

19 Claims, 14 Drawing Sheets

(56) References Cited

U.S. PATENT DOCUMENTS

| | | | | |
|---|---|---|---|---|
| 2014/0118292 A1* | 5/2014 | Kim | ................ | G06F 3/044 |
| | | | | 345/174 |
| 2014/0145999 A1* | 5/2014 | Den Boer | ............ | G06F 3/044 |
| | | | | 345/174 |
| 2014/0225864 A1* | 8/2014 | Chang | ............. | G06F 3/044 |
| | | | | 345/174 |
| 2014/0267953 A1* | 9/2014 | Kim | ................ | G06F 3/044 |
| | | | | 349/12 |
| 2014/0354903 A1* | 12/2014 | Wang | ............. | G06F 3/041 |
| | | | | 349/12 |

FOREIGN PATENT DOCUMENTS

| | | |
|---|---|---|
| KR | 10-2012-0075982 | 7/2012 |
| KR | 10-2012-0130992 | 12/2012 |
| KR | 10-1322946 | 10/2013 |
| KR | 10-2014-0000479 | 1/2014 |
| KR | 10-2014-0110270 | 9/2014 |

\* cited by examiner

TOUCH SCREEN PANEL FABRICATION METHOD AND TOUCH SCREEN PANEL

CROSS-REFERENCE TO RELATED APPLICATION

Korean Patent Application No. 10-2014-0101035, filed on Aug. 6, 2014, and entitled, "Touch Screen Panel Fabrication Method and Touch Screen Panel," is incorporated by reference herein in its entirety.

BACKGROUND

1. Field

One or more embodiments described herein relate to a touch screen panel fabrication method and a touch screen panel.

2. Description of the Related Art

A touch screen panel receives an input based on the position of a finger or object contacting a screen. This position corresponds to content displayed on the screen, and an operation is performed relating to this content when contact is made. For example, a touch screen panel may be provided on a front surface of the screen to convert a touch position to an electrical input signal. A touch screen panel may be used with other types of input devices, including but not limited to a keyboard or mouse, for performing various functions.

A variety of touch screen panels have been developed. Examples include a resistance film type, a light-sensing type, and a capacitance type. Among these, the capacitance type touch screen panel converts a touch position to an electrical signal by sensing a change in capacitance between a conductive sensing electrode and a neighboring sensing electrode or a ground electrode when a human hand or an object contacts the touch screen.

SUMMARY

In accordance with one embodiment, a touch screen panel fabrication method includes forming a metal layer on a substrate; patterning the metal layer to form a metal pattern including a pad metal layer, a wiring metal layer, a connection metal layer, and a sensing metal layer including metal lines having a mesh shape; forming a first transparent conductive layer on the substrate; forming an insulation layer on the first transparent conductive layer; patterning the insulation layer to form a wiring insulation layer, a connection insulation layer, and a sensing insulation layer; patterning the first transparent conductive layer to form a peripheral wiring, a connector, and a sensing electrode; forming a second transparent conductive layer on the substrate including the peripheral wiring, the connector, and the sensing electrode; and patterning the second transparent conductive layer to form a pad area and a bridge.

Forming the metal pattern may includes forming a photoresist layer on the metal layer; exposing the photoresist layer through a first mask and developing the photoresist layer to form a first photoresist pattern; and etching the metal layer by using the first photoresist pattern as a mask to form the pad metal layer, the wiring metal layer, the connection metal layer, and a sensing metal layer including the metal lines having the mesh shape.

Patterning the insulation layer may include forming a photoresist layer on the insulation layer; exposing the photoresist layer through a second mask and developing the photoresist layer to form a second photoresist pattern; and etching the insulation layer by using the photoresist pattern as a mask to form the wiring insulation layer, the connection insulation layer, and the sensing insulation layer.

Patterning the first transparent conductive layer may include etching the transparent conductive layer using the wiring insulation layer, the connection insulation layer, and the sensing insulation layer as a mask to form the peripheral wiring, the connector, and the sensing electrode.

Patterning the second transparent conductive layer may include forming a photoresist layer on the second transparent layer; exposing the photoresist layer through a third mask and developing the photoresist layer to form a third photoresist pattern; and etching the second transparent conductive layer using the third photoresist pattern as a mask to form the pad area and the bridge.

Each of the first transparent conductive layer and the second transparent conductive layer may include at least one of indium tin oxide (ITO), indium zinc oxide (IZO), or indium gallium zinc oxide (IGZO). The metal layer may include at least one of Cu, Ti, Al, Ag, Au, Pt, Mo, a palladium-copper alloy (APC), or a silver-palladium alloy (AP).

In accordance with another embodiment, a touch screen panel fabrication method includes forming a first transparent conductive layer on a substrate; patterning the first transparent conductive layer to form a transparent conductive pattern including a pad area, a wiring transparent conductive layer, a connection transparent conductive layer, and a sensing transparent conductive layer; forming a metal layer on the substrate; forming an insulation layer on the metal layer; patterning the insulation layer to form a wiring insulation layer, a connection insulation layer, and a sensing insulation layer; patterning the metal layer to form a peripheral wiring, a connector, and a sensing electrode; forming a second transparent conductive layer on the substrate including the pad area, the peripheral wiring, the connector, and the sensing electrode; and patterning the second transparent conductive layer to form a bridge.

Forming the transparent conductive pattern may include forming a photoresist layer on the first transparent layer; exposing the photoresist layer to light through a first mask and developing the photoresist layer to form a first photoresist pattern; and etching the first transparent conductive layer using the first photoresist pattern as a mask to form the pad area, the wiring transparent conductive layer, the connection transparent conductive layer, and the sensing transparent conductive layer.

Patterning the insulation layer may include forming a photoresist layer on the insulation layer; exposing the photoresist layer to light through a second mask and developing the photoresist layer to form a second photoresist pattern; and etching the insulation layer using the second photoresist pattern as a mask to form the wiring insulation layer, the connection insulation layer, and the sensing insulation layer.

Patterning the metal layer may include etching the metal layer using the connection insulation layer, the connection insulation layer and the sensing insulation layer as a mask to form the wiring insulation layer, the connection insulation layer, and the sensing insulation layer.

Forming the bridge may include forming a photoresist layer on the second transparent layer; exposing the photoresist layer to light through a third mask and developing the photoresist layer to form a third photoresist pattern; and etching the second transparent conductive layer using the third photoresist pattern as a mask to form the bridge.

In accordance with another embodiment, a touch screen panel includes a sensing electrode including first sensing electrodes and second sensing electrodes separated apart from each other in a first direction and a second direction intersecting the first direction; a connector connecting the second sensing electrodes spaced from each other in the second direction; a pad area electrically connected to the sensing electrode and including a pad metal layer and a pad transparent conductive layer having at least a portion on the pad metal layer; a peripheral wiring connecting the sensing electrode and the pad area and including a wiring metal layer, a wiring transparent conductive layer having at least a portion on the wiring metal layer, and a wiring insulation layer having at least a portion on the wiring transparent conductive layer; and a bridge connecting the first sensing electrodes spaced apart from each other in the first direction.

The sensing electrodes include a sensing metal layer including metal lines having a mesh shape on a same layer as each of the pad metal layer and the wiring metal layer; a sensing transparent conductive layer on the sensing metal layer and including a same material as the wiring transparent conductive layer; and a sensing insulation layer having at least a portion on the sensing transparent conductive layer and including a same material as the wiring insulation layer, and wherein the bridge contacts the sensing metal layer and overlaps each of the first sensing electrodes and connector. The bridge may have a same material as the pad transparent conductive layer.

The connector may include a connection metal layer on a same layer as each of the sensing metal layer, the pad metal layer and the wiring metal layer; a connection transparent conductive layer having at least a portion on the connection metal layer and including a same material as each of the sensing transparent conductive layer and the wiring transparent conductive layer; and a connection insulation layer having at least a portion on the connection transparent conductive layer and including a same material as each of the sensing insulation layer and the wiring insulation layer. The sensing transparent conductive layer may have an area greater than an area of the transparent metal layer, and the sensing insulation layer may have an area greater than an area of the sensing metal layer.

In accordance with another embodiment, a touch screen panel includes a sensing electrode including first sensing electrodes and second sensing electrodes separated from each other in a first direction and a second direction intersecting the first direction; a connector connecting the second sensing electrodes spaced apart from each other in the second direction; a pad area electrically connected to the sensing electrode; a peripheral wiring area connecting the sensing electrode and the pad area, and including a wiring transparent conductive layer on a same layer as the pad area, the wiring metal layer on the wiring transparent conductive layer, and a wiring insulation layer having at least a portion on the wiring metal later; and a bridge connecting the first sensing electrodes spaced apart from each other in the first direction.

The sensing electrodes includes a sensing transparent conductive layer on a same layer as each of the pad area and the wiring transparent conductive layer, and including a same material as each of the pad area and the wiring transparent conductive layer; a sensing metal layer on the sensing transparent conductive layer and including metal lines having a mesh shape; and a sensing insulation layer having at least a portion on the sensing metal layer, and including a same material as the wiring insulation layer, and wherein the bridge contacts the sensing transparent conductive layer and overlaps each of at least a portion of the first sensing electrodes and the connector.

The bridge may include at least one of indium tin oxide, indium zinc oxide, or indium gallium zinc oxide. The connector may include a connection transparent conductive layer on a same layer as each of the pad area and the wiring transparent conductive layer; a connection metal layer on the connection transparent conductive layer, and including a same material as each of the sensing metal layer and the wiring metal layer; and a connection insulation layer having at least a portion on the connection metal layer, and including a same material as each of the sensing insulation layer and the wiring insulation layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
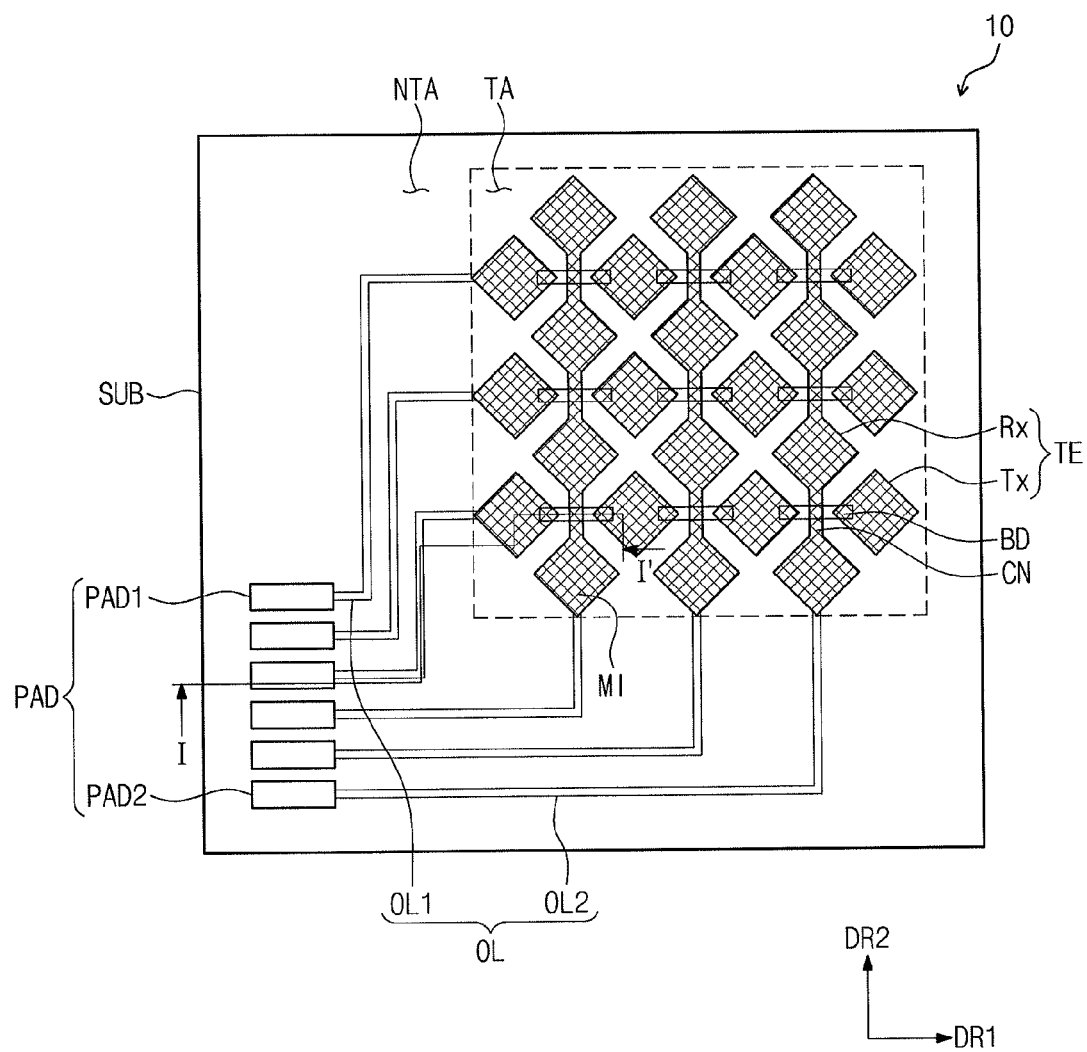
FIG. 1 illustrates an embodiment of a touch screen panel.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
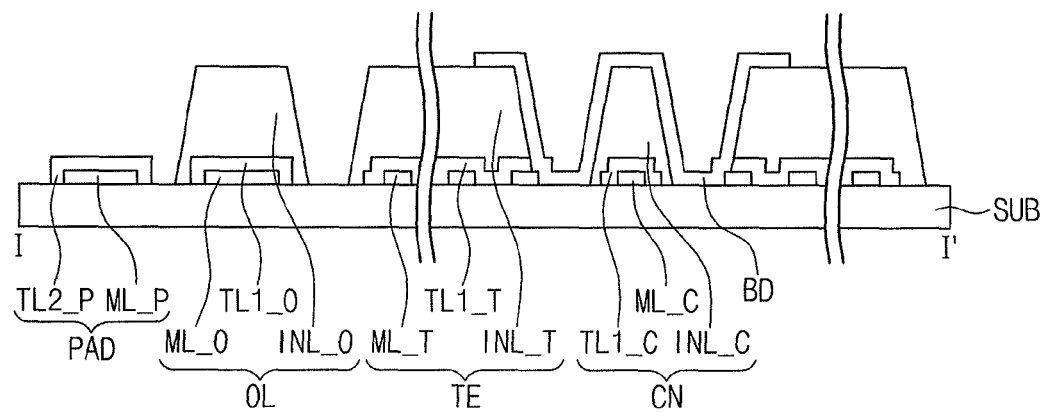
FIG. 2 illustrates an embodiment of a view along section line I-I' of FIG. 1.

FIG. 1 illustrates an embodiment of a touch screen panel 10, and FIG. 2 illustrates one embodiment of a cross-sectional view of the touch screen panel 10 along a line I-I' in FIG. 1. Referring to FIGS. 1 and 2, the touch screen panel 10 includes a substrate SUB, a sensing electrode TE including first sensing electrodes Tx and second sensing electrodes Rx, a connection unit CN, a pad unit (or pad area) PAD, a peripheral wiring OL, and a bridge BD.

A user may input instructions by touching the substrate SUB. The substrate SUB may be a transparent substrate, e.g., a transparent dielectric film. The substrate SUB may include, for example, plastic, glass, ceramic, or a polymer. The substrate SUB may be provided, for example, in the form of a plate.

The substrate SUB includes a touch non-recognizing area NTA and a touch recognizing area TA. The touch non-recognizing area does not sense a touch of a user. The touch recognizing area TA senses a touch of a user. For example, the touch non-recognizing area NTA may surround the touch recognizing area TA. The touch recognizing area may have a predetermined shape, e.g., approximately rectangular.

The touch non-recognizing area NTA on which the pad unit PAD and the peripheral wiring OL are disposed is, for example, a dead space area surrounding the touch recognizing area TA. In FIG. 1, the pad unit PAD is on a right side of the touch recognizing area TA. In another embodiment, the pad unit PAD may be at a different location, e.g., a left side, upper side, or lower side of the touch area TA.

The pad unit PAD is electrically connected to the sensing electrode TE and includes a pad metal layer ML_P and a pad transparent conductive layer TL2_P. The pad unit PAD is on the substrate SUB.

The pad metal layer ML_P may be formed of the same material as each of a sensing metal layer ML_T and a wiring metal layer ML_O. The pad metal layer ML_P is formed in the same process as each of the sensing metal layer ML_T and the wiring metal layer ML_O.

At least a portion of the pad transparent conductive layer TL2_P is formed on the pad metal layer ML_P. In FIG. 2, the pad transparent conductive layer TL2_P is formed on each of the pad metal layer ML_P and the substrate SUB. In another embodiment, the pad transparent conductive layer TL2_P may be formed on the pad metal layer ML_P.

The pad transparent conductive layer TL2_P may be formed of the same material as the bridge BD. The pad transparent conductive layer TL2_P may be formed in the same process as the bridge BD. In another embodiment, the pad transparent conductive layer TL2_P may be formed of the same material as the wiring transparent conductive layer TL1_O and may be formed in the same process as the wiring transparent conductive layer TL1_O.

The peripheral wiring OL connects the sensing electrode TE and the pad unit PAD, and includes the wiring metal layer ML_O, the wiring transparent conductive layer TL1_O, and a wiring insulation layer INL_O. The peripheral wiring OL is formed on the substrate SUB.

The wiring metal layer ML_O may be formed of the same material as each of the sensing metal layer ML_T and the pad metal layer ML_P. The wiring metal layer ML_O is formed in the same process as each of the sensing metal layer ML_T and the pad metal layer ML_P.

At least a portion of the wiring transparent conductive layer TL1_O is formed on the wiring metal layer ML_O. In FIG. 2, the wiring transparent conductive layer TL1_O is formed on each of the wiring metal layer ML_O and the substrate SUB. In another embodiment, the wiring transparent conductive layer TL1_O may be formed on the wiring metal layer ML_O.

The wiring transparent conductive layer TL1_O may be formed of the same material as a sensing transparent conductive layer TL1_T. The wiring transparent conductive layer TL1_O is formed in the same process as the sensing transparent conductive layer TL1_T.

At least a portion of the wiring insulation layer INL1_O may be formed on the wiring transparent conductive layer TL1_O. In FIG. 2, the wiring insulation layer INL_O is formed on each of the wiring transparent conductive layer TL1_O and the substrate SUB. In another embodiment, the wiring insulation layer INL_O may be formed on the wiring transparent conductive layer TL1_O.

The wiring insulation layer INL_O may be formed of the same material as a sensing insulation layer INL_T. The wiring insulation layer INL_O is formed in the same process as the sensing insulation layer INL_T.

The touch recognizing area TA is an area on which the sensing electrode TE is disposed, and senses a touch input by a user through the sensing electrode TE. When a touch is generated based on the touch by a user, capacitance is varied in the sensing electrode TE, for example, between the first sensing electrodes Tx and the second sensing electrodes Rx in the sensing electrode TE. Based on this variation of capacitance, a sensing signal supplied to the first sensing electrodes Tx may be delayed prior to being supplied to the second sensing electrodes Rx. The touch screen panel 10 may sense a touch coordinate from a delay value of the sensing signal.

The sensing electrode TE includes a sensing metal layer ML_T, a sensing transparent conductive layer TL1_T, and a sensing insulation layer INL_T.

The sensing metal layer ML_T includes metal lines Ml having a mesh shape, and is formed on the same layer as each of the wiring metal layer ML_O and the pad metal layer ML_P. The sensing metal layer ML_T may be formed of the same material as each of the wiring metal layer ML_O and the pad metal layer ML_P. The sensing metal layer ML_T may include, for example, at least one of Cu, Ti, Al, Ag, Au, Pt, Mo, a palladium-copper alloy (APC), or a silver-palladium alloy (AP). The materials have low specific resistance and thus may lower resistance of the sensing electrode TE. The sensing metal layer ML_T is formed in the same process as the wiring metal layer ML_O and the pad metal layer ML_P.

At least a portion of the sensing transparent conductive layer TL1_T may be formed on the sensing metal layer ML_T. In FIG. 2, the sensing transparent conductive layer TL1_T is formed on each of the sensing metal layer ML_T and the substrate SUB. In another embodiment, the sensing transparent conductive layer TL1_T may be formed on the sensing metal layer ML_T.

The sensing transparent conductive layer TL1_T may be formed of the same material as the wiring transparent conductive layer TL1_O. The sensing transparent conductive layer TL1_T may include, for example, a transparent conductive oxide (TCO). The transparent conductive oxide may include, for example, at least one of indium tin oxide (ITO), indium zinc oxide (IZO), or indium gallium zinc oxide (IGZO). Because these materials have high specific resistance, the sensing transparent conductive layer TL1_T may be made thick, so as to decrease the resistance when the materials are in the sensing electrode TE. The sensing transparent conductive layer TL1_T may be made thin when the materials are in the sensing electrode TE together with the sensing metal layer ML_T having low specific resistance. The sensing transparent conductive layer TL1_T is formed in the same process as the wiring transparent conductive layer TL1_O.

At least a portion of the sensing insulation layer INL_T may be formed on the sensing transparent conductive layer TL1_T. In FIG. 2, the sensing insulation layer INL_T is formed on each of the sensing transparent conductive layer TL1_T and the substrate SUB. In another embodiment, the sensing insulation layer INL_T may be formed on the sensing transparent conductive layer TL1_T.

The sensing insulation layer INL_T may be formed of the same material as the wiring insulation layer INL_O. The sensing insulation layer INL_T may include, for example, an organic insulation material. The sensing insulation layer INL_T may be formed in the same process as the wiring insulation layer INL_O.

As viewed from above, the sensing transparent conductive layer TL1_T may have an area greater than that of the sensing metal layer ML_T. The sensing insulation INL_T may have an area greater than that of the sensing metal layer ML_T. A shape of the sensing electrode TE may be defined by the sensing transparent conductive layer TL1_T and the sensing insulation layer INL_T. At least a portion of the sensing transparent conductive layer TL1_T may be formed on the sensing metal layer ML_T including metal lines Ml having a mesh shape. At least a portion of the sensing insulation layer INL_T is formed on the sensing transparent conductive layer TL1_T.

Because at least a portion of the sensing transparent conductive layer TL1_T is formed on the sensing metal layer ML_T including metal lines Ml having the mesh shape, as viewed from above (for example, as viewed in a thickness direction of the touch screen panel 10), the sensing transparent conductive layer TL1_T has an area greater than that of the sensing metal layer ML_T.

Because at least a portion of the sensing insulation layer INL_T is formed on the sensing transparent conductive layer TL1_T, and at least a portion of the sensing transparent insulation layer TL1_T is formed on the sensing metal layer ML_T including metal lines Ml having the mesh shape, as viewed from above (for example, as viewed in a thickness direction of the touch screen panel 10), the sensing insulation layer INL_T has an area greater than that of the sensing metal layer ML_T.

The sensing electrode TE is disposed in a matrix configuration having a plurality of rows extending in a first direction (for example, a DR1 direction in FIG. 1) and a plurality of columns extending in a second direction (for example, a DR2 direction in FIG. 1).

The sensing electrode TE includes the first sensing electrodes Tx and the second sensing electrodes Rx. The first sensing electrodes Tx and the second sensing electrodes Rx are electrically insulated from each other. Each of the first sensing electrodes Tx and the second sensing electrodes Rx may have a predetermined shape, e.g., approximately a rhombus, square, rectangular, circle, or an atypical shape (for example, a tangled branch shape, e.g., a dendrite structure).

The first sensing electrodes Tx are spaced apart from each other in each the first direction (for example, the DR1 direction in FIG. 1) and the second direction (for example, the DR2 direction in FIG. 1) which intersects the first direction (for example, the DR1 direction in FIG. 1). The first sensing electrodes Tx spaced apart from each other in the first direction (for example, the DR1 direction in FIG. 1) are connected to each other by the bridge BD.

The first sensing electrodes Tx include the sensing metal layer ML_T, the sensing transparent conductive layer TL1_T, and the sensing insulation layer INL_T. The sensing metal layer ML_T, the sensing transparent conductive layer TL1_T, and the sensing insulation layer INL_T may be as previously described.

The bridge BD connects the first sensing electrodes Tx spaced apart from each other in the first direction (for example, the DR1 direction in FIG. 1). The bridge BD contacts the sensing metal layer ML_T, and overlaps each of a portion of the first sensing electrodes Tx and the connection unit CN. The bridge BD is formed of the same material as the pad transparent conductive layer TL2_P. The bridge BD may include, for example, at least one selected of indium tin oxide (ITO), indium zinc oxide (IZO), or Indium gallium zinc oxide (IGZO). The bridge BD is formed in the same process as the pad transparent conductive layer TL2_P.

Among the first sensing electrodes Tx, the first sensing electrode, disposed on one end of the first sensing electrodes Tx constituting one row that extends in the first direction (for example, the DR1 direction in FIG. 1), is electrically connected to a first pad unit PAD1. In one embodiment, each of first sensing electrodes disposed on both ends of the first sensing electrodes Tx, constituting one row that extends in the first direction (for example, the DR1 direction in FIG. 1), may be electrically connected to the first pad unit PAD1.

Among the first sensing electrodes Tx, the first sensing electrode, disposed on one end of the first sensing electrodes Tx constituting one row that extends in the first direction (for example, the DR1 direction in FIG. 1), is connected to a first peripheral wiring OL1 and thus is electrically connected to the first pad unit PAD1. In one embodiment, each of first sensing electrodes both ends of the first sensing electrodes Tx, constituting one row that extends in the first direction (for example, the DR1 direction in FIG. 1), may be connected to the first peripheral wiring OL1 and thus may be electrically connected to the first pad unit PAD1.

The second sensing electrodes Rx are spaced apart from each other in the first direction (for example, the DR1 direction in FIG. 1) and the second direction (for example, the DR2 direction in FIG. 1).

The second sensing electrodes Rx include the sensing metal layer ML_T, the sensing transparent conductive layer TL1_T, and the sensing insulation layer INL_T. The sensing metal layer ML_T, the sensing transparent conductive layer TL1_T, and the sensing insulation layer INL_T may be as previously described.

The connection unit CN connects the second sensing electrodes Rx spaced apart from each other in the second direction (for example, the DR2 direction in FIG. 1). The connection unit CN includes a connection metal layer ML_C, a connection transparent conductive layer TL1_C, and a connection insulation layer INL_C.

The connection metal layer ML_C may be formed on the same layer as each of the sensing metal layer ML_T, the wiring metal layer ML_O, and the pad metal later ML_P. The connection metal layer ML_C may be formed of the same material as each of the sensing metal layer ML_T, the wiring metal layer ML_O, and the pad metal later ML_P. The connection metal layer ML_C is formed in the same process as the sensing metal layer ML_T, the wiring metal layer ML_O, and the pad metal layer ML_P. The connection metal layer ML_C includes metal lines Ml having a mesh shape similar to that of the sensing metal layer ML_T.

At least a portion of the connection transparent conductive layer TL1_C is formed on the connection metal layer ML_C. In FIG. 2, the connection transparent conductive layer TL1_C is formed on each of the connection metal layer ML_C and the substrate SUB. In one embodiment, the connection transparent conductive layer TL1_C may be formed on the connection metal layer ML_C.

The connection transparent conductive layer TL1_C may be formed of the same material as each of the sensing transparent conductive layer TL1_T and the wiring transparent conductive layer TL1_O. The connection transparent conductive layer TL1_C is formed in the same process as each of the sensing transparent conductive layer TL1_T and the wiring transparent conductive layer TL1_O.

At least a portion of the connection insulation layer INL_C may be formed on the connection transparent conductive layer TL1_C. In FIG. 2, the connection insulation layer INL_C may be formed on each of the connection transparent conductive layer TL1_C and the substrate SUB. In one embodiment, the connection insulation layer INL_C may be formed on the connection transparent conductive layer TL1_C.

The connection insulation layer INL_C may be formed of the same material as each of the sensing insulation layer INL_T and the wiring insulation layer INL_O. The connection insulation layer INL_C is formed in the same process as each of the sensing insulation layer INL_T and the wiring insulation layer INL_O.

Among the second sensing electrodes Rx, the second sensing electrode, disposed on one end of the second sensing electrodes Rx constituting one column that extends in the second direction (for example, the DR2 direction in FIG. 1), is electrically connected to a second pad unit PAD2. In another embodiment, each of second sensing electrodes disposed on both ends of the second sensing electrodes Rx, constituting one column that extends in the second direction (for example, the DR2 direction in FIG. 1), may be electrically connected to the second pad unit PAD2.

Among the second sensing electrodes Rx, the second sensing electrode, disposed on one end of the second sensing electrodes Rx constituting one column that extends in the second direction (for example, the DR2 direction in FIG. 1), is connected to a second peripheral wiring OL2, and thus is electrically connected to the second pad unit PAD2. In another embodiment, each of second sensing electrodes disposed on both ends of the second sensing electrodes Rx, constituting one column that extends in the second direction (for example, the DR2 direction in FIG. 1), may be connected to the second peripheral wiring OL2, and thus may be electrically connected to the second pad unit PAD2.

The touch screen panel 10 may be included in a variety of displays. Examples include field emission displays (FEDs), plasma display panels (PDPs), electroluminescence devices (ELs), and electrophoretic displays. The substrate SUB in the touch screen panel 10 may be a substrate of the display device.

In one type of touch screen panel that has been proposed, a sensing electrode TE and a peripheral wiring OL are formed in different processes. Also, a pad unit PAD and a bridge BD are formed in different processes. In accordance with one or more embodiments of the touch screen panel 10, the sensing electrode TE and the peripheral wiring OL are formed in a same process. Also, the pad unit PAD and the bridge BD are formed in a same process. As a result, the number of mask processes may be reduced, thereby reducing costs and a tact time (e.g., manufacturing time required per product unit for achieving a daily production target amount).

Figure 3:
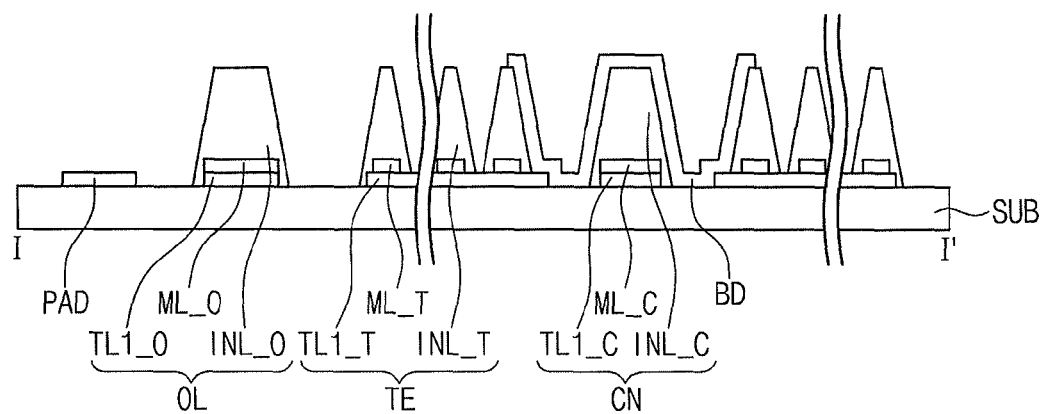
FIG. 3 illustrates another embodiment of a view along section line I-I' of FIG. 1.

FIG. 3 illustrates a cross-sectional view of another embodiment of the touch screen panel 10 taken along a line I-I' of FIG. 1. Referring to FIGS. 1 and 3, the touch screen panel 10 includes a substrate SUB, a sensing electrode TE, a connection unit CN, a pad unit PAD, a peripheral wiring OL, and a bridge BD.

The pad unit PAD is electrically connected to the sensing electrode TE. The pad unit PAD may be, for example, a transparent conductive oxide (TCO). The transparent conductive oxide may include, for example, at least one selected of indium tin oxide (ITO), indium zinc oxide (IZO), or indium gallium zinc oxide (IGZO).

The peripheral wiring OL connects the sensing electrode TE and the pad unit PAD. The peripheral wiring OL includes a wiring transparent conductive layer TL1_O, a wiring metal layer ML_O, and a wiring insulation layer INL_O.

The wiring transparent conductive layer TL1_O may be formed of the same material as a sensing transparent conductive layer TL1_T. The wiring transparent conductive layer TL1_O may be formed in the same process as the sensing transparent conductive layer TL1_T.

The wiring metal layer ML_O may be formed on the wiring transparent conductive layer TL1_O. The wiring metal layer ML_O may be formed of the same material as the sensing metal layer ML1_T. The wiring metal layer ML_O is formed in the same process as the sensing metal layer ML1_T.

At least a portion of the wiring insulation INL_O may be formed on the wiring metal layer ML_O. In FIG. 3, the wiring insulation layer INL_O is formed on each of the wiring metal layer ML_O and the substrate SUB. In another embodiment, the wiring insulation layer INL_O may be formed on each of the wiring metal layer ML_O, the wiring transparent conductive layer TL1_O, and the substrate SUB, may be formed on each of the wiring metal layer ML_O and the wiring transparent conductive layer TL1_O, or may be formed on the wiring metal layer ML_O.

The wiring insulation layer INL_O may be formed of the same material as a sensing insulation layer INL_T. The wiring insulation layer INL_O is formed in the same process as the sensing insulation layer INL_T.

The sensing electrode includes a sensing transparent conductive layer TL1_T, a sensing metal layer ML_T, and a sensing insulation layer INL_T.

The sensing transparent conductive layer TL1_T may be formed on the same layer as each of the pad unit PAD and the peripheral wiring OL. The sensing transparent conductive layer TL1_T may be formed of the same material as each of the pad unit PAD and the sensing transparent conductive layer TL1_O. The sensing transparent conductive layer TL1_T may be formed, for example, of a transparent conductive oxide (TCO). The transparent conductive oxide may include, for example, at least one of indium tin oxide (ITO), indium zinc oxide (IZO), or indium gallium zinc oxide (IGZO).

The sensing metal layer ML_T may be formed on the sensing transparent conductive layer TL1_T. The sensing metal layer ML_T may include metal lines having a mesh shape. The sensing metal layer ML_T may include, for example, at least one of Cu, Ti, Al, Ag, Au, Pt, Mo, a palladium-copper alloy (APC), or a silver-palladium alloy (AP).

At least a portion of the sensing insulation layer INL_T may be formed on the sensing metal layer ML_T. In FIG. 3, the sensing insulation layer INL_T is formed on each of the sensing metal layer ML_T, the sensing transparent conductive layer TL1_T, and the substrate SUB. In one embodiment, the sensing insulation layer INL_T may be formed on the sensing metal layer ML_T and the sensing transparent conductive layer TL1_T, and may be formed on the sensing metal layer ML_T.

The sensing insulation layer INL_T may be formed of the same material as the wiring insulation layer INL_O. The sensing insulation layer INL_T may be formed of, for example, an organic insulation material. The sensing insulation layer INL_T is formed in the same process as the wiring insulation layer INL_O.

The sensing electrode TE is disposed in a matrix configuration having a plurality of rows that extend in a first direction (for example, a DR1 direction in FIG. 1) and a plurality of columns that extend in a second direction (for example, a DR2 direction in FIG. 1).

The sensing electrode TE includes first sensing electrodes Tx and second sensing electrodes Rx. The first sensing electrodes Tx are spaced apart from each other in each the first direction (for example, the DR1 direction in FIG. 1) and the second direction (for example, the DR2 direction in FIG. 1) intersecting the first direction (for example, the DR1 direction in FIG. 1). The first sensing electrodes Tx spaced apart from each other in the first direction (for example, the DR1 direction in FIG. 1) are connected to each other by the bridge BD.

The first sensing electrodes Tx are spaced apart from each other in each the first direction (for example, the DR1 direction in FIG. 2) and the second direction (for example, the DR2 direction in FIG. 1) intersecting the first direction (for example, the DR1 direction in FIG. 1). The second sensing electrodes Rx spaced apart from each other in the first direction (for example, the DR1 direction in FIG. 2) are connected to each other by the connection unit CN.

The bridge BD connects the first sensing electrodes Tx spaced apart from each other in the first direction (for example, the DR1 direction in FIG. 1). The bridge BD contacts the sensing transparent conductive layer TL1_T, and overlaps each of a portion of the first sensing electrodes Tx and the connection unit CN. The bridge BD may include, for example, of indium tin oxide (ITO), indium zinc oxide (IZO), or indium gallium zinc oxide (IGZO).

The connection unit CN connects the second sensing electrodes Rx spaced apart from each other in the second direction (for example, the DR2 direction in FIG. 1). The connection unit CN includes a connection metal layer ML_C, a connection transparent conductive layer TL1_C, and a connection insulation layer INL_C.

The connection transparent conductive layer TL1_C may be formed on a same layer as each of the pad unit PAD and the wiring transparent conductive layer TL1_O. The connection transparent conductive layer TL1_C may be formed of the same material as each of the pad unit PAD and the wiring transparent conductive layer TL1_O. The connection transparent conductive layer TL1_C is formed in the same process as each of the pad unit PAD and the wiring transparent conductive layer TL1_O.

The connection metal layer ML_C may be formed on the connection transparent conductive layer TL1_C. The connection metal layer ML_C may be formed of a same material as the sensing metal layer ML_T. The connection metal layer ML_C is formed in the same process as the sensing metal layer ML_T. The connection metal layer ML_C includes metal lines Ml having a mesh shape similar to that of the sensing metal layer ML_T.

At least a portion of the connection insulation layer INL_C may be formed on the connection metal layer ML_C. In FIG. 3, the connection insulation layer INL_C is formed on each of the connection metal layer ML_C and the substrate SUB. In another embodiment, the connection insulation layer INL_C may be formed on each of the connection metal layer ML_C, the connection transparent conductive layer TL1_C and the substrate SUB, may be formed on each of the connection metal layer ML_C and the connection transparent conductive layer TL1_C, or may be formed on the connection metal layer ML_C.

The connection insulation layer INL_C may be formed of the same material as each of the sensing insulation layer INL_T and the wiring insulation layer INL_O. The connection insulation layer INL_C may be formed of a same material as each of the sensing insulation layer INL_T and the wiring insulation layer INL_O.

In one type of touch screen panel that has been proposed, a sensing electrode TE, a peripheral wiring, and a bridge are formed in different processes. In accordance with one or more embodiments of the touch screen panel 10, the peripheral wiring OL and the bridge BD are formed while the sensing electrode TE is formed, to thereby reduce costs and a tact time (manufacturing time required per product unit for achieving a daily production target amount).

Figure 4:
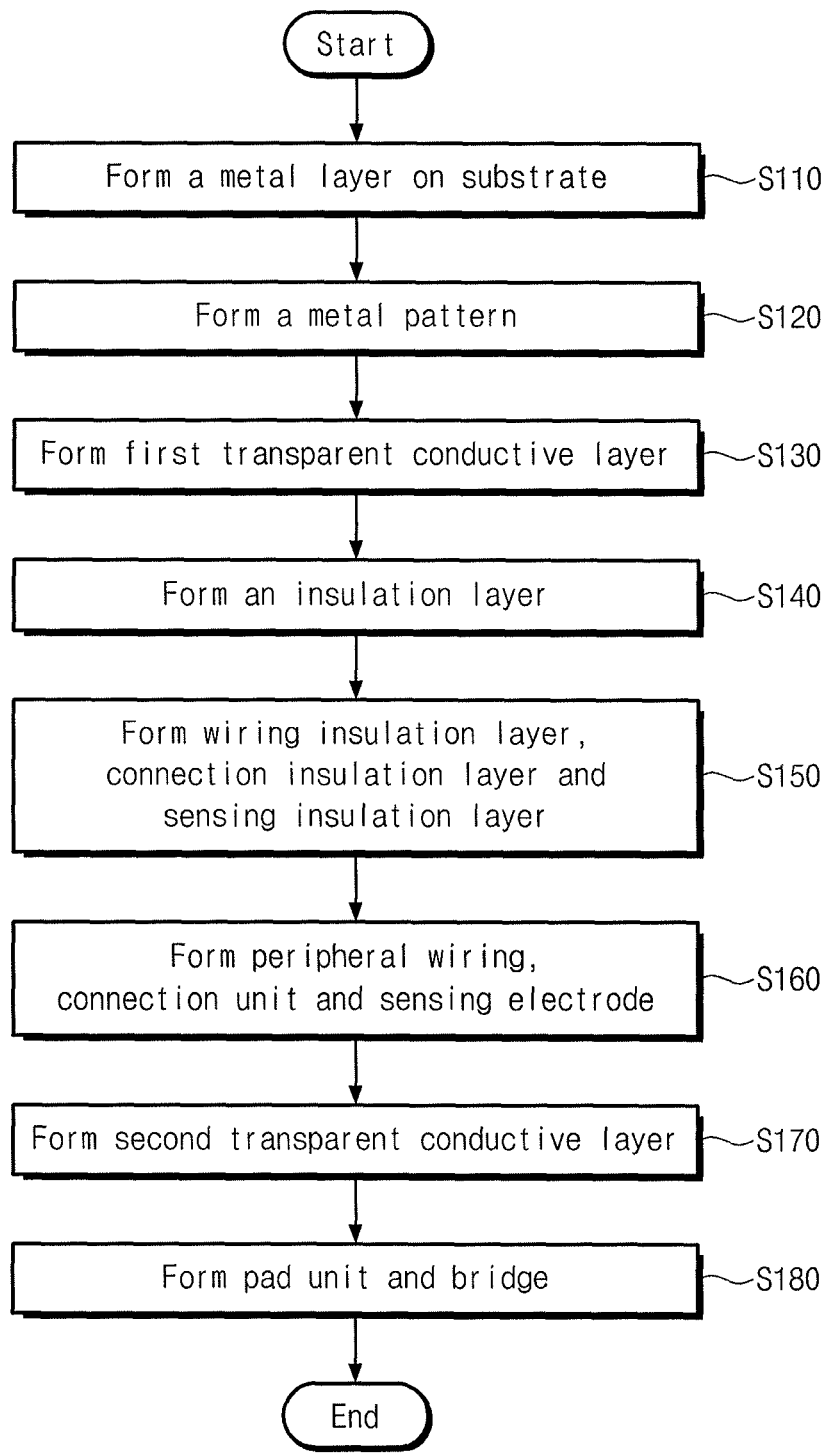
FIG. 4 illustrates an embodiment of a touch screen fabrication method.
Figure 5A:
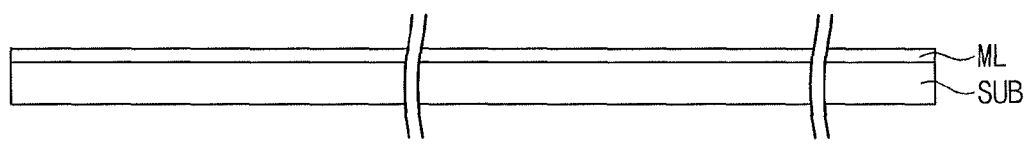
FIGS. 5A to 5J illustrate different stages of the touch screen fabrication method.
Figure 5B:
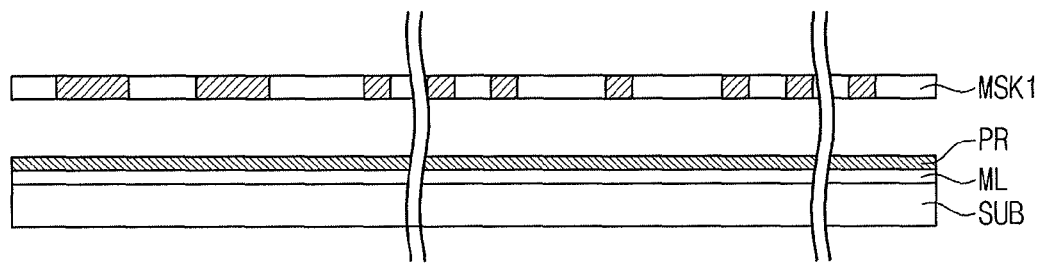
Figure 5C:
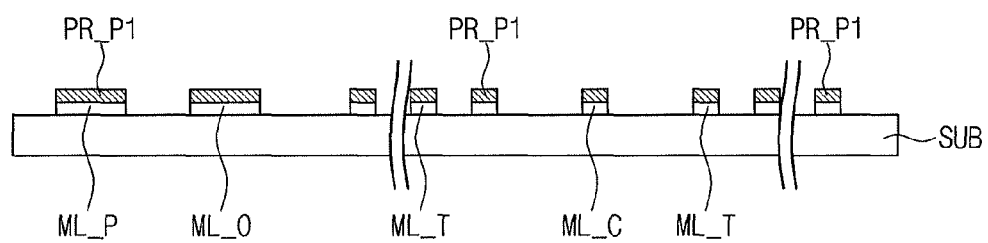
Figure 5D:
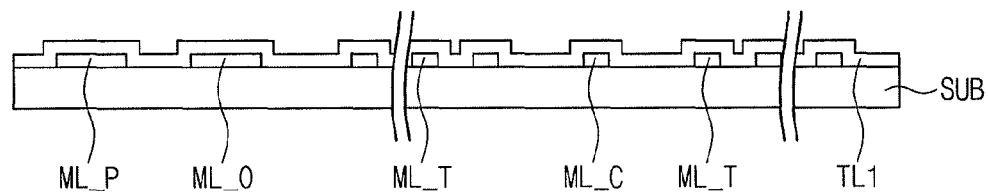
Figure 5E:
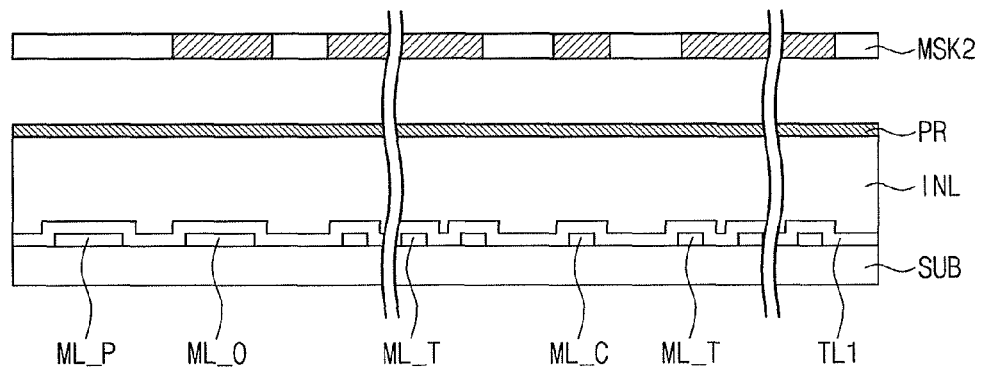
Figure 5F:
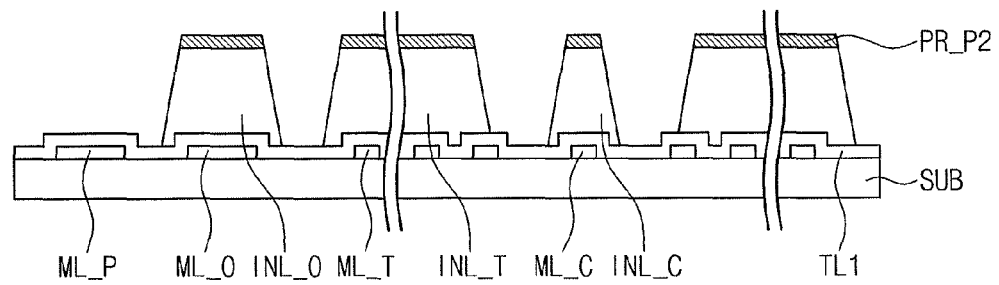
Figure 5G:
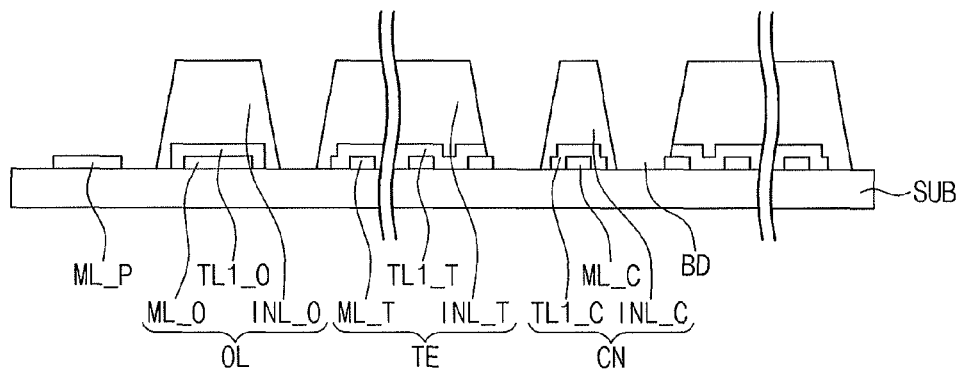
Figure 5H:
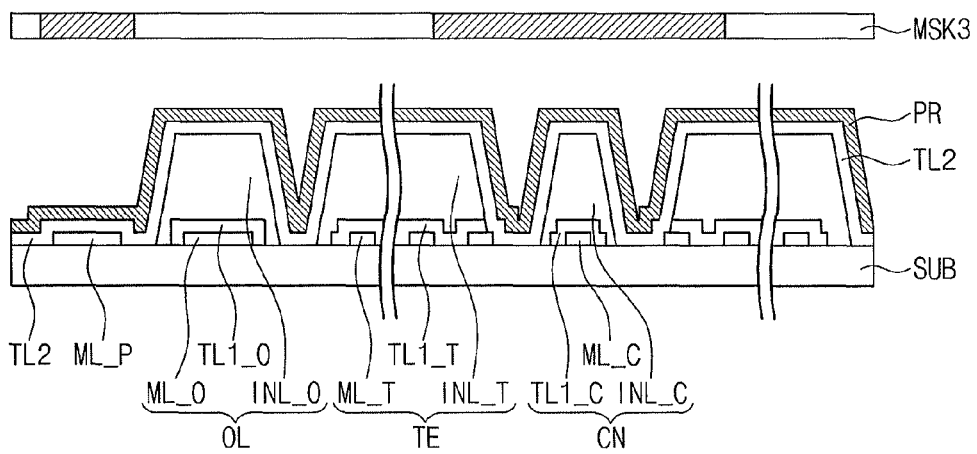
Figure 5I:
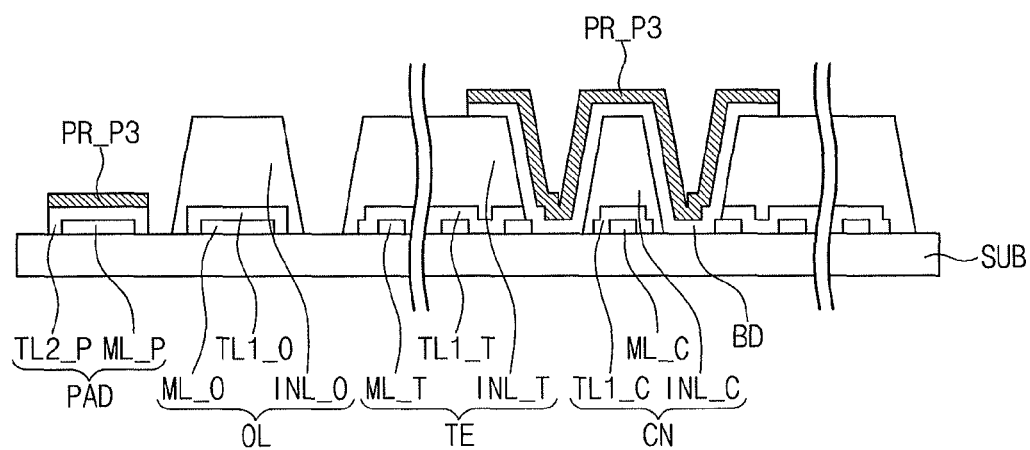
Figure 5J:
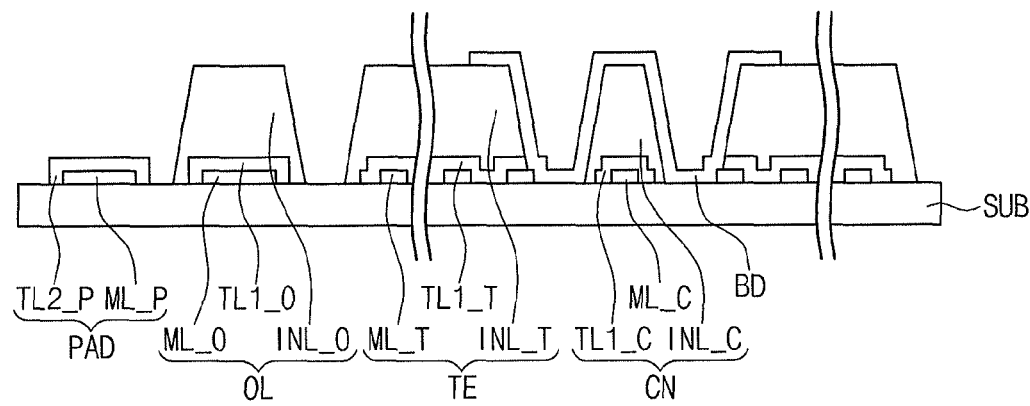

FIG. 4 illustrates an embodiment of a touch screen panel fabrication method, and FIGS. 5A to 5J illustrate different stages of the method. Referring to FIGS. 1, 2 and 4, the touch screen panel fabrication method includes forming a metal layer ML on a substrate SUB (S110), patterning the metal layer ML to form a metal pattern including a pad metal layer ML_P, a wiring metal layer ML_O, a connection metal layer ML_C and a sensing metal layer ML_T including metal lines Ml having a mesh shape (S120), forming a first transparent conductive layer TL1 on the substrate SUB on which the metal pattern is formed (S130), forming an insulation layer INL on the first transparent conductive layer TL1 (S140), patterning the insulation layer INL to form a wiring insulation layer INL_O, a connection insulation layer INL_C and a sensing insulation layer INL_T (S150), patterning the first transparent conductive layer TL1 to form a peripheral wiring OL, a connection unit CN and a sensing electrode TE (S160), forming a second transparent layer TL2 on the substrate SUB on which the peripheral wiring OL, the connection unit CN and the sensing electrode TE are formed (S170), and patterning the second transparent insulation layer TL2 to form a pad unit PAD and a bridge BD (S180).

Referring to FIGS. 1, 2, 4, and 5A, a metal layer ML is formed on a substrate SUB (S110). The substrate SUB is a transparent substrate SUB and may be, for example, a transparent dielectric film. The substrate SUB may include, for example, plastic, glass, ceramic, or a polymer. The metal layer ML may include, for example, at least one of Cu, Ti, Al, Ag, Au, Pt, Mo, a palladium-copper alloy (APC), or a silver-palladium alloy (AP).

In accordance with one embodiment, the touch screen panel fabrication method includes patterning the metal layer ML to form a metal pattern including a pad metal layer ML_P, a wiring metal layer ML_O, a connection metal layer ML_C, and a sensing metal layer ML_T including metal lines Ml having a mesh shape (S120). Forming of the metal pattern (S120) may include forming a photoresist layer PR on the metal layer ML, exposing the photoresist layer PR to light through a first mask and developing the photoresist layer PR to form a first photoresist pattern PR_P1, and etching the metal layer ML using the photoresist pattern PR_P1 as a mask to form a metal pattern including the pad metal layer ML_P, the wiring metal layer ML_O, the connection metal layer ML_C, and the sensing metal layer ML_T including metal lines Ml having the mesh shape.

Referring to FIGS. 1, 2, 4, and 5B, a photoresist layer PR is formed on the metal layer ML. The photoresist layer PR may be formed, for example, by applying photoresist. The first mask MSK1 is disposed on the photoresist layer PR.

Referring to FIGS. 1, 2, 4, and 5C, the photoresist layer PR is exposed to light through the first mask MSK1 and developed to form the first photoresist pattern PR_P1. The first photoresist pattern PR_P1 is formed on the pad metal layer ML_P, the wiring metal layer ML_O, the connection metal layer ML_C, and the sensing metal layer ML_T including metal lines Ml having the mesh shape. The metal pattern is formed using the first photoresist pattern PR_P1 as a mask. The metal pattern includes the pad metal layer ML_P, the wiring metal layer ML_O, the connection metal layer ML_C, and the sensing metal layer ML_T including metal lines Ml having the mesh shape. The connection metal layer ML_C may include metal lines Ml having a mesh shape similar to that of the sensing metal layer ML_T.

Referring to FIGS. 1, 2, 4, and 5D, the first photoresist pattern PR_P1 is removed. A first transparent conductive layer TL1 is formed on the substrate SUB on which the metal pattern is formed (S130). The first transparent conductive layer TL1 may be formed, for example, of a transparent conductive oxide (TCO). The transparent conductive oxide may include, for example, at least one selected of indium tin oxide (ITO), indium zinc oxide (IZO), or indium gallium zinc oxide (IGZO).

Referring to FIGS. 1, 2, 4, and 5E, an insulation layer INL is formed on the first transparent conductive layer TL1 (S140). The insulation layer INL may be formed of, for example, an organic insulation material.

In accordance with one embodiment, a touch screen panel fabrication method includes patterning the insulation layer INL to form a wiring insulation layer INL_O, a connection insulation layer INL_C, and a sensing insulation layer INL_T (S150). The patterning of the insulation layer (S150) may include forming a photoresist layer PR on the insulation layer PR, exposing the photoresist layer PR to light through a second mask and developing the photoresist layer PR to form a second photoresist pattern PR_P2, and etching the insulation layer INL by using the photoresist pattern PR_P2 as a mask to form the wiring insulation layer INL_O, the connection insulation layer INL_C, and the sensing insulation layer INL_T.

Referring to FIGS. 1, 2, 4, and 5E, the photoresist layer PR is formed on the insulation layer INL. The photoresist layer PR may be formed, for example, by applying photoresist. The first mask MSK2 is disposed on the photoresist layer PR.

Referring to FIGS. 1, 2, 4, and 5F, the photoresist layer PR is exposed to light through the second mask and developed to form the second photoresist pattern PR_P2. The photoresist pattern PR_P2 is formed on the wiring insulation layer INL_O, the connection insulation layer INL_C, and the sensing insulation layer INL_T. The insulation layer INL is etched using the second photoresist pattern PR_P2 as a mask. The wiring insulation layer INL_O, the connection insulation layer INL_C, and the sensing insulation layer INL_T are formed by etching the insulation layer INL.

In accordance with one embodiment, the touch screen panel fabrication method includes patterning the first transparent conductive layer TL1 to form a peripheral wiring OL, a connection unit CN, and a sensing electrode (S160). Patterning of the first transparent conductive layer TL1 to form the peripheral wiring OL, the connection unit CN, and the sensing electrode TE (S160) may include etching the first transparent conductive layer TL1 using the wiring insulation layer INL_O, the connection insulation layer INL_C, and the sensing insulation layer INL_T as a mask to form the peripheral wiring OL, the connection unit CN, and the sensing electrode TE.

Referring to FIGS. 1, 2, 4, and 5G, the first transparent conductive layer TL1 is etched using the wiring insulation layer INL_O, the connection insulation layer INL_C, and the sensing insulation layer INL_T as a mask. A wiring transparent conductive layer TL1_O, a connection transparent conductive layer TL1_C, and a sensing transparent conductive layer TL1_T are formed by etching the first transparent conductive layer TL1.

At least a portion of the wiring transparent conductive layer TL1_O is formed on the wiring metal layer ML_O. The wiring transparent conductive layer TL1_O is formed on each of the wiring metal layer ML_O and the substrate SUB. At least a portion of the connection transparent conductive layer TL1_C is formed on the connection metal layer ML_C. The connection transparent conductive layer TL1_C is formed on each of the connection metal layer ML_C and the substrate SUB.

At least a portion of the sensing transparent conductive layer TL1_T is formed on the sensing metal layer ML_T including the metal lines Ml having the mesh shape. The sensing transparent conductive layer TL1_C is formed on each of the sensing metal layer ML_T and the substrate SUB.

The peripheral wiring OL formed in the patterning of the first transparent conductive layer TL1 (S160) includes the wiring metal layer ML_O and the wiring transparent conductive layer TL1_O having at least a portion formed on the wiring metal layer ML_O.

The connection unit CN formed in the patterning the first transparent conductive layer TL1 (S160) includes the connection metal layer ML_C, the connection transparent conductive layer TL1_C having at least a portion formed on the connection metal layer ML_C, and the connection insulation layer IN_C having at least a portion formed on the connection transparent conductive layer TL1_C.

The sensing electrode layer TE formed in the patterning of the first transparent conductive layer TL1 (S160) includes the sensing metal layer ML_T including metal lines Ml having the mesh shape, the sensing transparent conductive layer TL1_T having at least a portion formed on the sensing metal layer ML_T, and the sensing insulation layer INL_T having at least a portion formed on the sensing transparent conductive layer TL1_T.

Patterning of the first transparent conductive layer TL1 (S160) may further include heating the wiring insulation layer INL_O, the connection insulation layer INL_C, and the sensing insulation layer INL_T. When the first transparent conductive layer TL1 is etched in the patterning of the first transparent conductive layer TL1, a skew occurs on at least one side of each of the wiring transparent conductive layer TL1_O, the connection transparent conductive layer TL1_C, and the sensing transparent conductive layer TL1_T. Thus, the wiring insulation layer INL_O may not cover at least one side of the wiring transparent conductive layer TL1_O. The connection insulation layer INL_C may not cover at least one side of the connection transparent conductive layer TL1_C. The sensing insulation layer INL_T may not cover at least one side of the sensing transparent conductive layer TL1_T.

When the wiring insulation layer INL_O, the connection insulation layer INL_C, and the sensing insulation layer INL_T are heated, a portion of each of the wiring insulation layer INL_O, the connection insulation layer INL_C, and the sensing insulation layer INL_T may move downward. Thus, the wiring insulation layer INL_O may cover at least one side of the wiring transparent conductive layer TL1_O. The connection insulation layer INL_C may cover at least one side of the connection transparent conductive layer TL1_C. The sensing insulation layer INL_T may cover at least one side of the sensing transparent conductive layer TL1_T. The wiring insulation layer INL_O may cover at least one side of the wiring metal layer ML_O. The connection metal layer ML_C may cover at least one side of the connection metal layer ML_C. The sensing insulation layer INL_T may cover at least one side of the sensing metal layer ML_T.

Referring to FIGS. 1, 2, 4, and 5H, a second transparent conductive layer TL2 is formed on the substrate SUB on which the peripheral wiring OL, the connection unit CN, and the sensing electrode TE is formed (S170). The second transparent conductive layer TL2 may be formed, for example, of a transparent conductive oxide (TCO). The transparent conductive oxide may include, for example, at least one of indium tin oxide (ITO), indium zinc oxide (IZO), or indium gallium zinc oxide (IGZO).

In accordance with one embodiment, a touch screen panel fabrication method includes patterning the second transparent conductive layer TL2 to form a pad unit PAD and a bridge (S180). Patterning of the second transparent conductive layer (S180) may include forming a photoresist layer PR on the second transparent conductive layer TL2, exposing the photoresist layer PR to light through a third mask MSK3 and developing the photoresist layer PR to form a third photoresist pattern PR_P3, and etching the second transparent conductive layer TL2 using the third photoresist pattern PR_P3 as a mask to form the pad unit and the bridge.

Referring to FIGS. 1, 2, 4, and 5H, the photoresist layer PR is formed on the second transparent conductive layer TL2. The photoresist layer PR may be formed, for example, by applying photoresist. The third mask MSK3 is disposed on the photoresist layer PR.

Referring to FIGS. 1, 2, 4, and 5I, the photoresist layer PR is exposed to light and developed to form the third photoresist pattern PR_P3 through the second mask MSK3. The third photoresist pattern PR_P3 is formed on the pad transparent conductive layer TL2_P and the bridge BD. The second transparent conductive layer TL2 is etched using the third photoresist pattern PR_P3 as a mask. The pad transparent conductive layer TL2_P and the bridge BD are formed by etching the second transparent conductive layer TL2. At least a portion of the pad transparent conductive layer TL2_P is formed on the pad metal layer ML_P.

Referring to FIGS. 1, 2, 4, and 5J, the third photoresist pattern PR_P3 is removed. The pad unit PAD formed in the patterning of the second transparent conductive layer TL2 (S180) includes the pad metal layer ML_P and the pad transparent conductive TL2_P having at least a portion formed on the pad metal layer ML_P. The bridge BD formed in the patterning of the second transparent conductive layer TL2 contacts the sensing metal layer ML_T, and overlaps each of a portion of the sensing electrode TE and the connection unit CN.

In one type of touch screen panel fabrication method that has been proposed, a sensing electrode TE and a peripheral wiring are formed in different processes, and a pad unit PAD and a bridge BD are formed in different processes. In accordance with one or more embodiments of the touch screen panel fabrication method, the sensing electrode TE and the peripheral wiring OL are formed in the same process, and the pad unit PAD and the bridge BD are formed in the same process, thereby reducing the number of mask processes. Also, in these or other embodiments, a touch screen panel may be fabricated using three masks, thereby reducing costs and tact time (manufacturing time required per product unit for achieving a daily production target amount).

Figure 6:
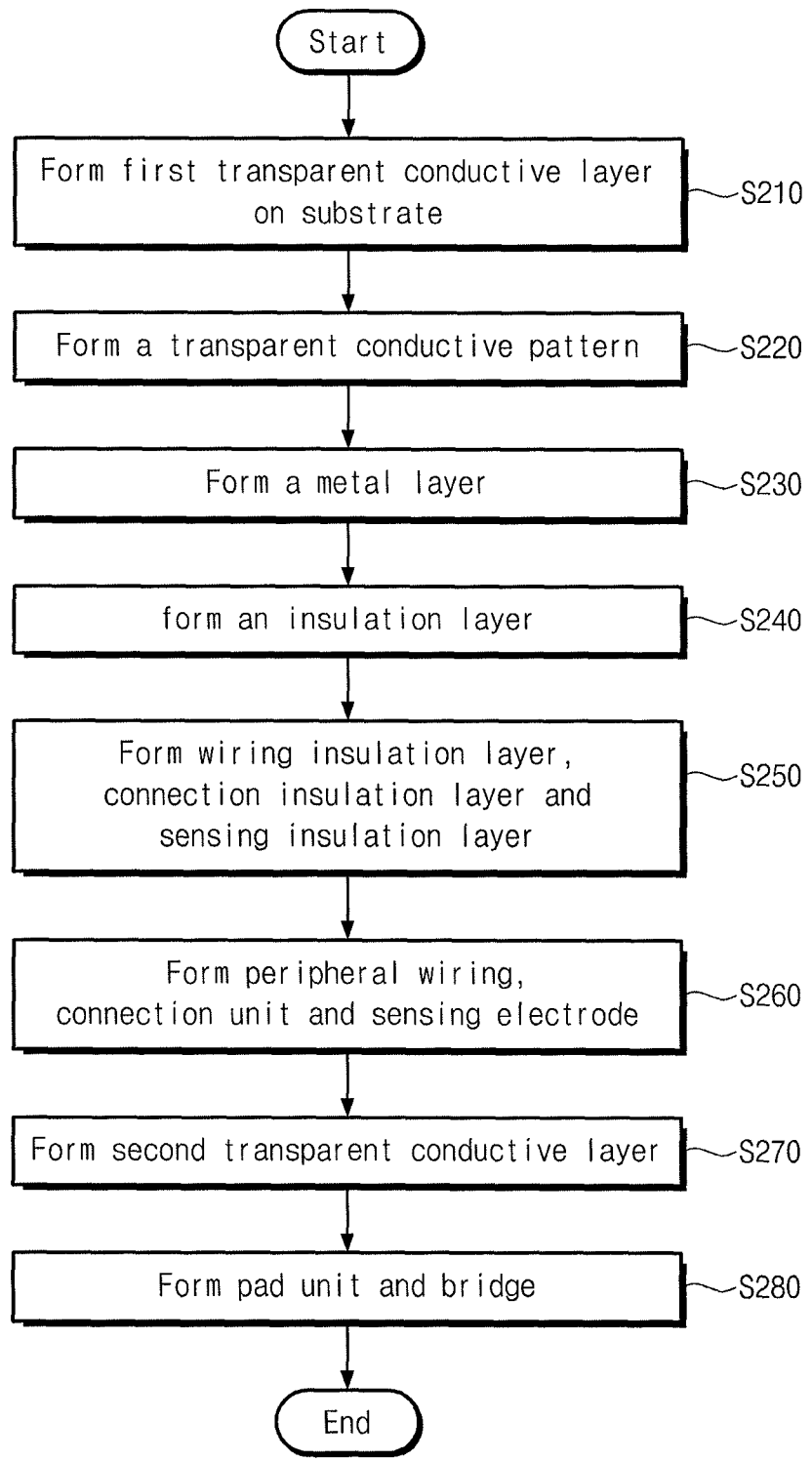
FIG. 6 illustrates another embodiment of a touch screen fabrication method.
Figure 7A:
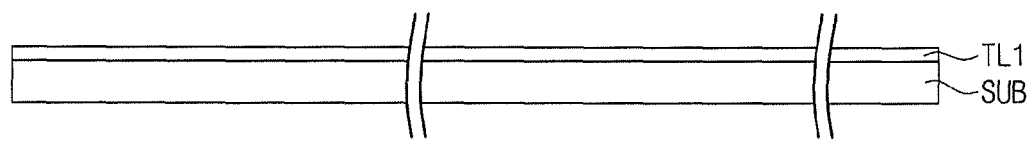
FIGS. 7A to 7J illustrate different stages of the touch screen fabrication method.
Figure 7B:
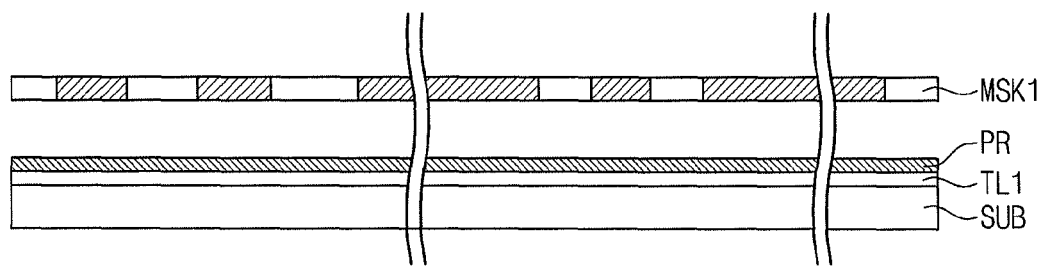
Figure 7C:
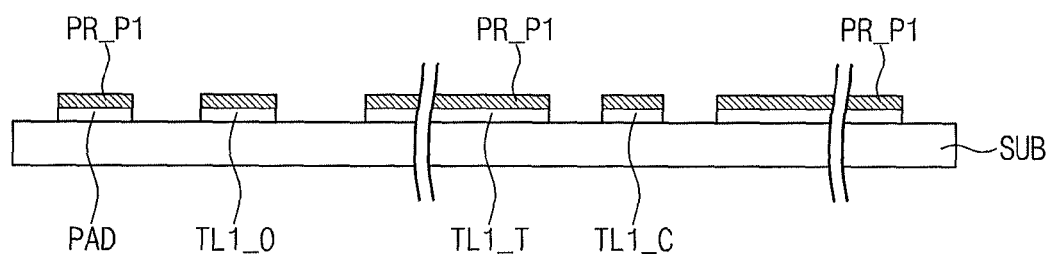
Figure 7D:
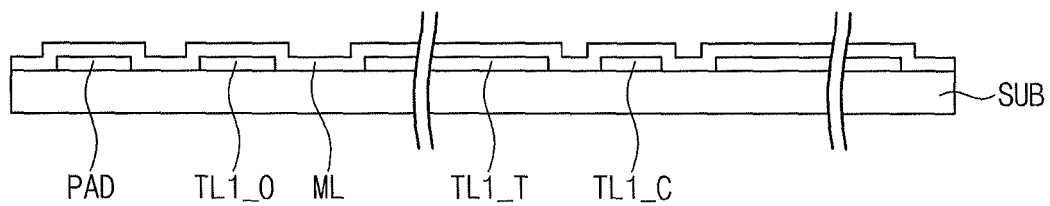
Figure 7E:
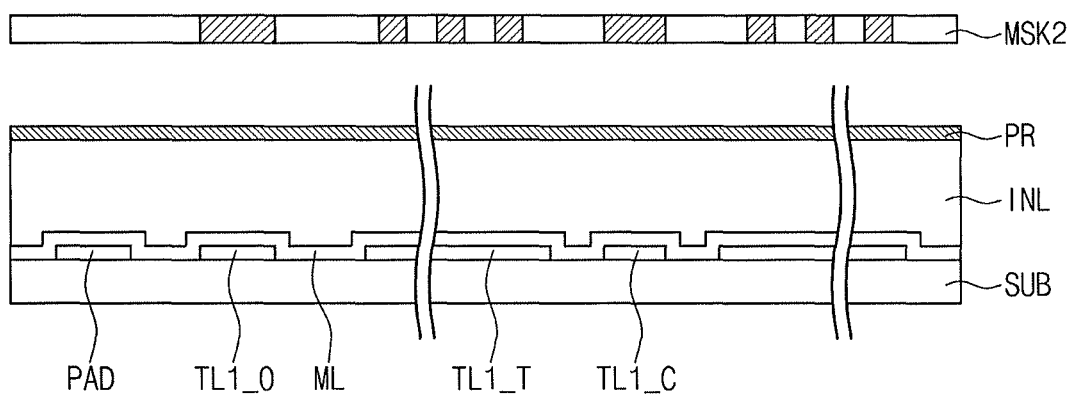
Figure 7F:
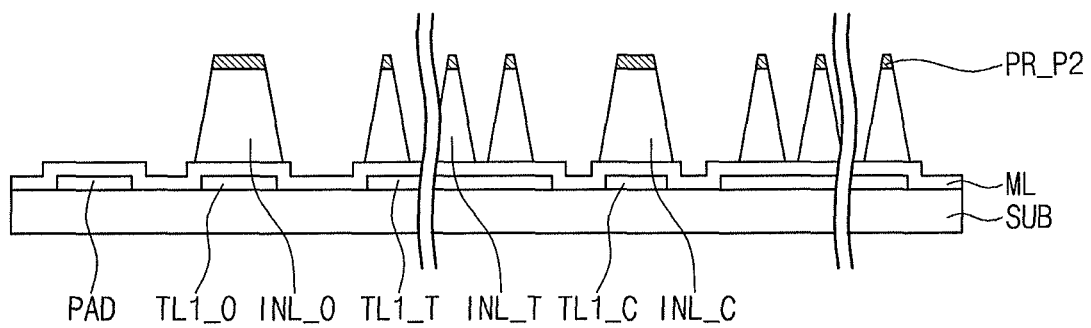
Figure 7G:
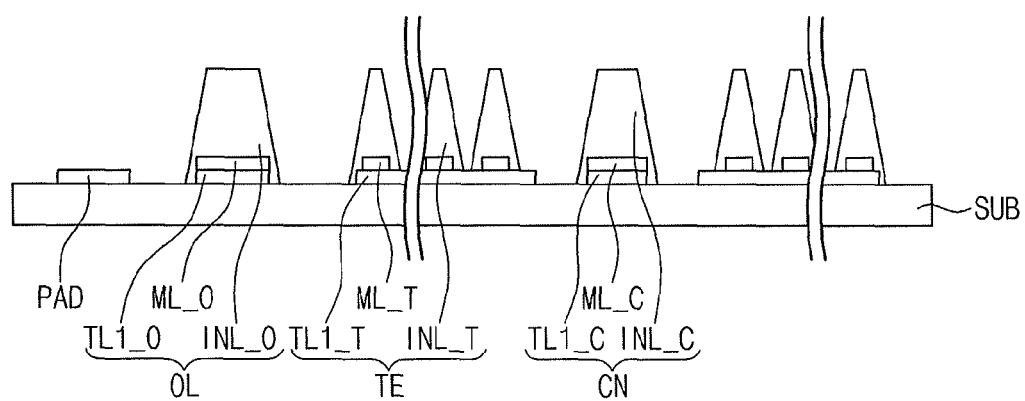
Figure 7H:
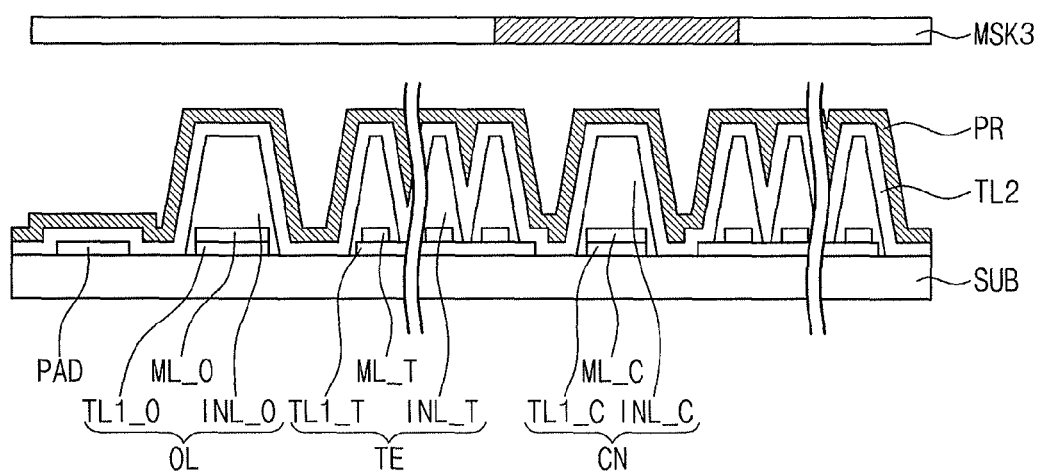
Figure 7I:
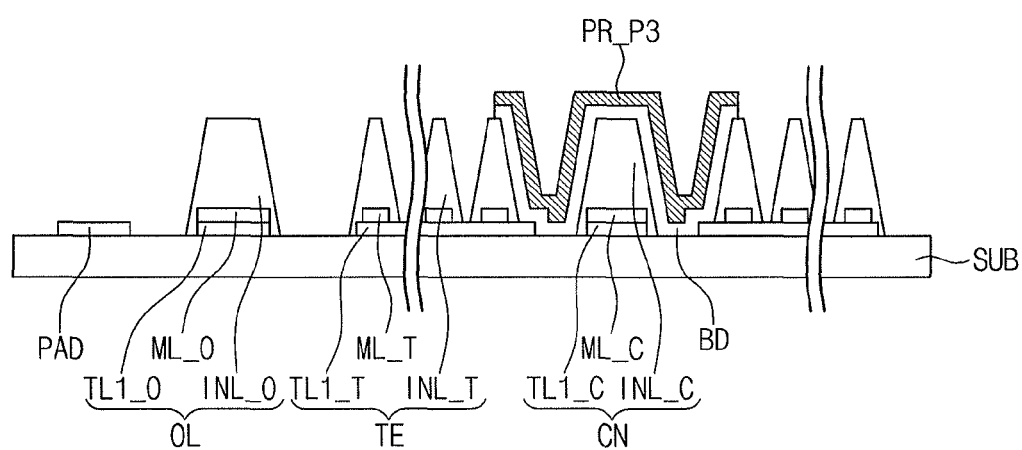
Figure 7J:
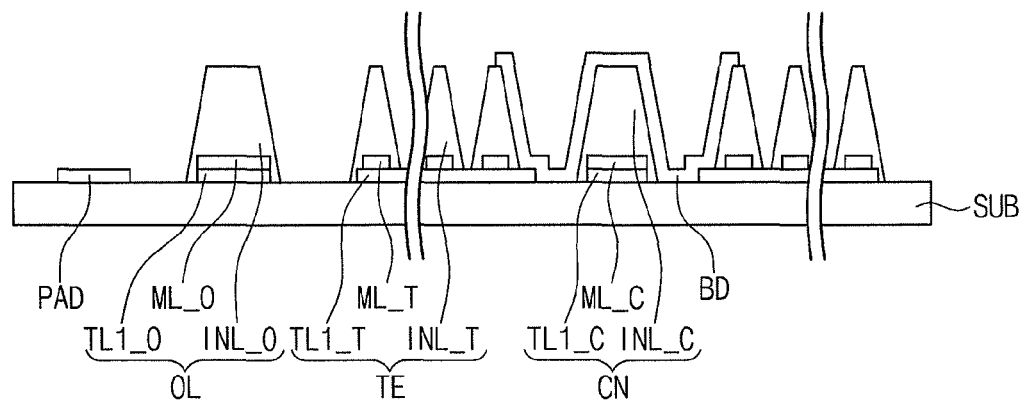

FIG. 6 illustrates another embodiment of a touch screen panel fabrication method, and FIGS. 7A to 7J illustrate cross-sectional views of different stages of the method.

Referring to FIGS. 1, 3 and 6, the method includes forming a first transparent conductive TL1 on a substrate SUB (S210), patterning the first transparent conductive layer TL1 to form a transparent conductive pattern including a pad unit PAD, a wiring transparent conductive layer TL1_O, and a sensing transparent conductive layer TL1_T (S220), forming a metal layer ML on the substrate SUB on which the transparent conductive pattern is formed (S230), forming an insulation layer INL on the metal layer ML (S240), patterning the insulation layer INL to form a wiring insulation layer INL_O, a connection insulation layer INL_C and a sensing insulation layer INL_T (S250), patterning the metal layer ML to form a peripheral wiring OL, a connection unit CN and a sensing electrode TE (S260), forming a second transparent layer TL2 on the substrate SUB on which the peripheral wiring OL, the connection unit CN and the sensing electrode TE are formed (S270), and patterning the second transparent insulation layer TL2 to form a bridge BD (S280).

Referring to FIGS. 1, 3, 6, and 7A, a second transparent conductive layer TL1 is formed on a substrate SUB (S210). The substrate SUB is a transparent substrate SUB and may be formed, for example, of a transparent dielectric film. The substrate SUB may include, for example, plastic, glass, ceramic, or a polymer.

The first transparent conductive layer TL1 may be formed, for example, of transparent conductive oxide (TCO). The transparent conductive oxide may include, for example, at least one of indium tin oxide (ITO), indium zinc oxide (IZO), or indium gallium zinc oxide (IGZO).

In accordance with one embodiment, a touch screen panel fabrication method includes patterning the first transparent conductive layer TL1 to form a transparent conductive pattern including a pad unit PAD, a peripheral wiring OL, a connection unit CN, a connection transparent conductive layer TL1_C and a sensing transparent conductive layer TL1_T (S220). Forming of the transparent conductive pattern (S120) may include forming a photoresist layer PR on the transparent conductive layer TL1, exposing the photoresist layer PR to light through a first mask MSK1 and developing the photoresist layer PR to form a first photoresist pattern PR_P1, and etching the first transparent conductive layer TL1 using the first photoresist pattern PR_P1 as a mask to form a transparent conductive pattern including the pad unit PAD, the wiring transparent conductive layer TL1_O, the connection transparent conductive layer TL1_C, and the sensing transparent conductive layer TL1_T.

Referring to FIGS. 1, 3, 6, and 7B, a photoresist layer PR is formed on the first transparent conductive layer TL1. The photoresist layer PR may be formed, for example, by applying photoresist. The first mask MSK1 is disposed on the photoresist layer PR.

Referring to FIGS. 1, 3, 6, and 7C, the photoresist layer PR is exposed to light and developed to form the first photoresist pattern PR_P1 using the first mask MSK1. The first photoresist pattern PR_P1 is formed on the pad unit PAD, the wiring transparent conductive layer TL1_O, the connection transparent conductive layer TL1_C, and the sensing transparent conductive layer TL1_T. The transparent conductive pattern is formed using the first photoresist pattern PR_P1 as a mask. The transparent conductive pattern includes the pad unit PAD, the wiring transparent conductive layer TL1_O, the connection transparent conductive layer TL1_C, and the sensing transparent conductive layer TL1_T.

Referring to FIGS. 1, 3, 6, and 7D, the first photoresist pattern PR_P1 is removed. The metal layer ML is formed on the substrate SUB on which the transparent conductive layer is formed (S230). The metal layer ML may include, for example, at least one of Cu, Ti, Al, Ag, Au, Pt, Mo, a palladium-copper alloy (APC), or a silver-palladium alloy (AP).

Referring to FIGS. 1, 3, 6, and 7E, the insulation layer INL is formed on the metal layer ML (S240). The insulation layer INL may be formed of, for example, an organic insulation material.

In accordance with one embodiment, a touch screen panel fabrication method includes patterning the insulation layer INL to form a wiring insulation layer INL_O, a connection insulation layer INL_C, and a sensing insulation layer INL_T (S250). Patterning of the insulation layer (S250) may include forming a photoresist layer PR on the insulation layer PR, exposing the photoresist layer PR to light through a second mask MSK2 and developing the photoresist layer PR to form a second photoresist pattern PR_P2, and etching the insulation layer INL by using the photoresist pattern PR_P2 as a mask to form the wiring insulation layer INL_O, the connection insulation layer INL_C, and the sensing insulation layer INL_T.

Referring to FIGS. 1, 3, 6, and 7E, the photoresist layer PR is formed on the insulation layer INL. The photoresist layer PR may be formed, for example, by applying photoresist. The second mask MSK2 is disposed on the photoresist layer PR.

Referring to FIGS. 1, 3, 6, and 7F, the photoresist layer PR is exposed to light through the second mask MSK2 and developed to form the second photoresist pattern PR_P2. The second photoresist pattern PR_P2 is formed on the wiring insulation layer INL_O, the connection insulation layer INL_C and the sensing insulation layer INL_T. The insulation layer INL is etched using the second photoresist pattern PR_P2 as a mask. The wiring insulation layer INL_O, the connection insulation layer INL_C, and the sensing insulation layer INL_T are formed by etching the insulation layer INL.

In accordance with one embodiment, a touch screen panel fabrication method includes patterning the first transparent conductive layer TL1 to form a peripheral wiring OL, a connection unit CN, and a sensing electrode (S260). Patterning of the metal later ML may include etching the metal layer ML by using the wiring insulation layer INL_O, the connection insulation layer INL_C, and the sensing insulation layer INL_T as a mask to form the peripheral wiring OL, the connection unit CN, and the sensing electrode TE.

Referring to FIGS. 1, 3, 6, and 7G, the metal layer ML is etched using the wiring insulation layer INL_O, the connection insulation layer INL_C, and the sensing insulation layer INL_T as a mask. The wiring metal layer ML_O, the connection metal layer ML_C, and the sensing metal layer ML_T are formed by etching the metal layer ML. In one embodiment, the wiring metal layer ML_O, the connection metal layer ML_C, and the sensing metal layer ML_T are formed using the wiring insulation layer INL_O, the connection insulation layer INL_C, and the sensing insulation layer INL_T as a mask. In another embodiment, the wiring metal layer ML_O, the connection metal layer ML_C, and the sensing metal layer ML_T may be formed using separate masks.

The wiring metal layer ML_O is formed on the wiring transparent conductive layer TL1_O. The connection metal layer ML_C is formed on the connection transparent conductive layer TL1_C. The sensing metal layer ML_T is formed on the sensing transparent conductive layer TL1_T.

The peripheral wiring OL formed in the patterning the metal layer ML (S260) includes the wiring transparent conductive layer TL1_O, the wiring metal layer ML_O formed on the wiring transparent conductive layer TL1_O, and the wiring insulation layer INL_O having at least portion formed on the wiring metal layer ML_O.

The connection unit CN formed in the patterning of the metal layer ML (S260) includes the connection transparent conductive layer TL1_C, the connection metal layer ML_C formed on the connection transparent conductive layer TL1_C, and the connection insulation layer INL_O having at least portion formed on the connection metal layer ML_C.

The sensing electrode TE formed in the patterning of the metal layer ML (S260) includes the sensing transparent conductive layer TL1_T, the sensing metal layer formed on the sensing transparent conductive layer TL1_T and including metal lines Ml having a mesh shape, and the sensing insulation layer INL_T having at least a portion formed on the sensing metal layer ML_T.

Patterning of the metal layer ML (S260) may include heating the wiring insulation layer INL_O, the connection insulation layer INL_C, and the sensing insulation layer INL_T. When the metal layer ML is etched in the patterning of the metal layer ML (S260), a skew may occur on at least one side of each of the wiring metal layer ML_O, the connection metal layer ML_C, and the sensing metal layer ML_T. Thus, the wiring insulation layer INL_O may not cover at least one side of the wiring metal layer ML_O. The connection insulation layer INL_C may not cover at least one side of the connection metal layer ML_C. The sensing insulation layer INL_T may not cover at least one side of the sensing metal layer ML_T.

When the wiring insulation layer INL_O, the connection insulation layer INL_C, and the sensing insulation layer INL_T are heated, a portion of each of the wiring insulation layer INL_O, the connection insulation layer INL_C, and the sensing insulation layer INL_T may move downward. Thus, the wiring insulation layer INL_O may cover at least one side of the wiring metal layer ML_O. The connection insulation layer INL_C may cover at least one side of the connection metal layer ML_C. The sensing insulation layer INL_T may cover at least one side of the sensing metal layer ML_T. The wiring insulation layer INL_O may cover at least one side of the wiring transparent conductive layer TL1_O. The connection insulation layer INL_C may cover at least one side of the connection transparent conductive layer TL1_C. The sensing insulation layer INL_T may cover at least one side of the sensing transparent conductive layer TL1_T.

Referring to FIGS. 1, 3, 6, and 7H, a second transparent conductive layer TL2 is formed on the substrate SUB on which the pad unit PAD, the peripheral wiring OL, the connection unit CN, and the sensing electrode TE (S270). The second transparent conductive layer TL2 may be formed, for example, of a transparent conductive oxide (TCO). The transparent conductive oxide may include, for example, at least one of indium tin oxide (ITO), indium zinc oxide (IZO), or indium gallium zinc oxide (IGZO).

In accordance with one embodiment, a touch screen panel fabrication method includes patterning the second transparent conductive layer TL2 to form a bridge (S280). Patterning of the second transparent conductive layer (S280) may include forming a photoresist layer PR on the second transparent conductive layer TL2, exposing the photoresist layer PR to light through a third mask MSK3 and developing the photoresist layer PR to form a third photoresist pattern PR_P3, and etching the second transparent conductive layer TL2 by using the third photoresist pattern PR_P3 as a mask to form the bridge.

Referring to FIGS. 1, 3, 6, and 7H, the photoresist layer PR is formed on the second transparent conductive layer TL2. The photoresist layer PR may be formed, for example, by applying photoresist. The third mask MSK1 is disposed on the photoresist layer PR.

Referring to FIGS. 1, 3, 6, and 7I, the photoresist layer PR is exposed to light through the third mask MSK3 and developed to form the third photoresist pattern PR_P3. The third photoresist pattern PR_P3 is formed on the bridge BD. The second transparent conductive layer TL2 is etched using the third photoresist pattern PR_P3 as a mask. The bridge BD is formed by etching the second transparent conductive layer TL2.

Referring to FIGS. 1, 3, 6, and 7J, the third photoresist pattern PR_P3 is removed. The bridge BD formed in the forming the bridge BD (S280) contacts the sensing transparent conductive layer TL1_T, and overlaps each of a portion of the first sensing electrode TE and the connection unit CN.

In one type of touch screen panel that has been proposed, a sensing electrode TE, a peripheral wiring, and a bridge are formed in different processes. In accordance with one or more embodiments, a peripheral wiring and a bridge of a touch screen panel are formed while a sensing electrode is formed, thereby reducing the number of mask processes. In these or other embodiments, a touch screen may be fabricated using three masks, to thereby reduce costs and tact time (manufacturing time required per product unit for achieving a daily production target amount).

By way of summation and review, in some touch screen panels, a sensing electrode TE, a peripheral wiring, and a bridge are formed by different processes. In accordance with one or more embodiments of a touch screen panel, peripheral wiring and a bridge are formed while a sensing electrode is formed, thereby reducing the number of mask processes to be performed. In accordance with one or more embodiments of a touch screen panel fabrication method, a touch screen may be fabricated using three masks, thereby reducing costs and tact time (manufacturing time required per product unit for achieving a daily production target amount).

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A touch screen panel fabrication method, comprising:
    forming a metal layer on a substrate;
    patterning the metal layer to form a metal pattern including a pad metal layer, a wiring metal layer, a connection metal layer, and a sensing metal layer including metal lines having a mesh shape;
    forming a first transparent conductive layer on the substrate;
    forming an insulation layer on the first transparent conductive layer;
    patterning the insulation layer to form a wiring insulation layer, a connection insulation layer, and a sensing insulation layer;
    patterning the first transparent conductive layer to form a peripheral wiring, a connector, and a sensing electrode;
    forming a second transparent conductive layer on the substrate including the peripheral wiring, the connector, and the sensing electrode; and
    patterning the second transparent conductive layer to form a pad area and a bridge.

2. The method as claimed in claim 1, wherein forming the metal pattern includes:
    forming a photoresist layer on the metal layer;
    exposing the photoresist layer through a first mask and developing the photoresist layer to form a first photoresist pattern; and
    etching the metal layer by using the first photoresist pattern as a mask to form the pad metal layer, the wiring metal layer, the connection metal layer, and a sensing metal layer including the metal lines having the mesh shape.

3. The method as claimed in claim 1, wherein patterning the insulation layer includes:
    forming a photoresist layer on the insulation layer;
    exposing the photoresist layer through a second mask and developing the photoresist layer to form a second photoresist pattern; and
    etching the insulation layer by using the photoresist pattern as a mask to form the wiring insulation layer, the connection insulation layer, and the sensing insulation layer.

4. The method as claimed in claim 1, wherein patterning the first transparent conductive layer includes etching the transparent conductive layer using the wiring insulation layer, the connection insulation layer, and the sensing insulation layer as a mask to form the peripheral wiring, the connector, and the sensing electrode.

5. The method as claimed in claim 1, wherein patterning the second transparent conductive layer includes:
    forming a photoresist layer on the second transparent layer;
    exposing the photoresist layer through a third mask and developing the photoresist layer to form a third photoresist pattern; and
    etching the second transparent conductive layer using the third photoresist pattern as a mask to form the pad area and the bridge.

6. The method as claimed in claim 1, wherein each of the first transparent conductive layer and the second transparent conductive layer includes at least one of indium tin oxide (ITO), indium zinc oxide (IZO), or indium gallium zinc oxide (IGZO).

7. The method as claimed in claim 1, wherein the metal layer includes at least one of Cu, Ti, Al, Ag, Au, Pt, Mo, a palladium-copper alloy (APC), or a silver-palladium alloy (AP).

8. A touch screen panel fabrication method, comprising:
    forming a first transparent conductive layer on a substrate;
    patterning the first transparent conductive layer to form a transparent conductive pattern including a pad area, a wiring transparent conductive layer, a connection transparent conductive layer, and a sensing transparent conductive layer;
    forming a metal layer on the substrate;
    forming an insulation layer on the metal layer;

patterning the insulation layer to form a wiring insulation layer, a connection insulation layer, and a sensing insulation layer;

patterning the metal layer to form a peripheral wiring, a connector, and a sensing electrode;

forming a second transparent conductive layer on the substrate including the pad area, the peripheral wiring, the connector, and the sensing electrode; and patterning the second transparent conductive layer to form a bridge.

9. The method as claimed in claim 8, wherein forming the transparent conductive pattern includes:

forming a photoresist layer on the first transparent layer;

exposing the photoresist layer to light through a first mask and developing the photoresist layer to form a first photoresist pattern; and etching the first transparent conductive layer using the first photoresist pattern as a mask to form the pad area, the wiring transparent conductive layer, the connection transparent conductive layer, and the sensing transparent conductive layer.

10. The method as claimed in claim 8, wherein patterning the insulation layer includes:

forming a photoresist layer on the insulation layer;

exposing the photoresist layer to light through a second mask and developing the photoresist layer to form a second photoresist pattern; and etching the insulation layer using the second photoresist pattern as a mask to form the wiring insulation layer, the connection insulation layer, and the sensing insulation layer.

11. The method as claimed in claim 8, wherein patterning the metal layer includes etching the metal layer using the connection insulation layer, the connection insulation layer and the sensing insulation layer as a mask to form the wiring insulation layer, the connection insulation layer, and the sensing insulation layer.

12. The method as claimed in claim 8, wherein forming the bridge includes:

forming a photoresist layer on the second transparent layer;

exposing the photoresist layer to light through a third mask and developing the photoresist layer to form a third photoresist pattern; and etching the second transparent conductive layer using the third photoresist pattern as a mask to form the bridge.

13. A touch screen panel, comprising:

a sensing electrode including first sensing electrodes and second sensing electrodes separated apart from each other in a first direction and a second direction intersecting the first direction;

a connector connecting the second sensing electrodes spaced from each other in the second direction;

a pad area electrically connected to the sensing electrode and including a pad metal layer and a pad transparent conductive layer having at least a portion on the pad metal layer;

a peripheral wiring connecting the sensing electrode and the pad area and including a wiring metal layer, a wiring transparent conductive layer having at least a portion on the wiring metal layer, and a wiring insulation layer having at least a portion on the wiring transparent conductive layer; and a bridge connecting the first sensing electrodes spaced apart from each other in the first direction, wherein the sensing electrodes include:

a sensing metal layer including metal lines having a mesh shape on a same layer as each of the pad metal layer and the wiring metal layer;

a sensing transparent conductive layer on the sensing metal layer and including a same material as the wiring transparent conductive layer; and a sensing insulation layer having at least a portion on the sensing transparent conductive layer and including a same material as the wiring insulation layer, and wherein the bridge contacts the sensing metal layer and overlaps each of the first sensing electrodes and the connector.

14. The panel as claimed in claim 13, wherein the bridge includes a same material as the pad transparent conductive layer.

15. The touch screen panel as claimed in claim 13, wherein the connector includes:

a connection metal layer on a same layer as each of the sensing metal layer, the pad metal layer and the wiring metal layer;

a connection transparent conductive layer having at least a portion on the connection metal layer and including a same material as each of the sensing transparent conductive layer and the wiring transparent conductive layer; and a connection insulation layer having at least a portion on the connection transparent conductive layer and including a same material as each of the sensing insulation layer and the wiring insulation layer.

16. The panel as claimed in claim 13, wherein:

the sensing transparent conductive layer has an area greater than an area of the transparent metal layer, and the sensing insulation layer has an area greater than an area of the sensing metal layer.

17. A touch screen panel, comprising:

a sensing electrode including first sensing electrodes and second sensing electrodes separated from each other in a first direction and a second direction intersecting the first direction;

a connector connecting the second sensing electrodes spaced apart from each other in the second direction;

a pad area electrically connected to the sensing electrode;

peripheral wiring connecting the sensing electrode and the pad area, and including a wiring transparent conductive layer on a same layer as the pad area, a wiring metal layer on the wiring transparent conductive layer, and a wiring insulation layer having at least a portion on the wiring metal layer; and a bridge connecting the first sensing electrodes spaced apart from each other in the first direction, wherein the sensing electrodes include:

a sensing transparent conductive layer on a same layer as each of the pad area and the wiring transparent conductive layer, and including a same material as each of the pad area and the wiring transparent conductive layer;

a sensing metal layer on the sensing transparent conductive layer and including metal lines having a mesh shape; and a sensing insulation layer having at least a portion on the sensing metal layer, and including a same material as the wiring insulation layer, and wherein the bridge contacts the sensing transparent conductive layer and overlaps each of at least a portion of the first sensing electrodes and the connector.

18. The panel as claimed in claim 17, wherein the bridge includes at least one of indium tin oxide, indium zinc oxide, or indium gallium zinc oxide.

19. The panel as claimed in claim 17, wherein the connector includes:
- a connection transparent conductive layer on a same layer as each of the pad area and the wiring transparent conductive layer;
- a connection metal layer on the connection transparent conductive layer, and including a same material as each of the sensing metal layer and the wiring metal layer; and
- a connection insulation layer having at least a portion on the connection metal layer, and including a same material as each of the sensing insulation layer and the wiring insulation layer.

* * * * *